United States Patent
Riggsby

(10) Patent No.: US 8,296,818 B2
(45) Date of Patent: Oct. 23, 2012

(54) DISTRIBUTION AND AMPLIFICATION SYSTEMS THAT AUTOMATICALLY TERMINATE TO A MATCHED TERMINATION IN RESPONSE TO POWER INTERRUPTIONS AND RELATED METHODS

(75) Inventor: Robert Ryan Riggsby, Hickory, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 349 days.

(21) Appl. No.: 12/779,119

(22) Filed: May 13, 2010

(65) Prior Publication Data

US 2011/0283331 A1 Nov. 17, 2011

(51) Int. Cl.
*H04N 7/173* (2006.01)
(52) U.S. Cl. ......................... 725/127; 725/128
(58) Field of Classification Search .................. None
See application file for complete search history.

(56) References Cited

U.S. PATENT DOCUMENTS

| | | | |
|---|---|---|---|
| 2006/0015921 A1* | 1/2006 | Vaughan | 725/127 |
| 2006/0205442 A1 | 9/2006 | Phillips | |
| 2009/0047917 A1* | 2/2009 | Phillips et al. | 455/127.1 |
| 2010/0162340 A1* | 6/2010 | Riggsby | 725/127 |

OTHER PUBLICATIONS

U.S. Appl. No. 12/689,267, filed Jan. 19, 2010.

* cited by examiner

*Primary Examiner* — Cai Chen
(74) *Attorney, Agent, or Firm* — Myers Bigel Sibley & Sajovec

(57) ABSTRACT

Distribution and amplification systems for cable television networks include a tap unit having a first RF tap port and a second RF tap port, a voice-over IP ("VoIP") RF signal amplifier and a non-VoIP RF signal amplifier. The VoIP RF signal amplifier is connected to the first RF tap port of the tap unit, and includes an amplified signal path and a passive, non-interruptible signal path. The non-VoIP RF signal amplifier is connected to the second RF tap port of the tap unit, and includes an amplified signal path. The VoIP and non-VoIP RF signal amplifiers are each configured to terminate their amplified signal paths to respective matched terminations in response to a power outage.

20 Claims, 8 Drawing Sheets

DISTRIBUTION AND AMPLIFICATION SYSTEMS THAT AUTOMATICALLY TERMINATE TO A MATCHED TERMINATION IN RESPONSE TO POWER INTERRUPTIONS AND RELATED METHODS

FIELD OF THE INVENTION

The present invention is directed to cable television ("CATV") networks and, more particularly, to distribution and amplification systems for CATV networks.

BACKGROUND

Cable television networks refer to communications networks that are used to transmit cable television signals and/or other information between one or more service providers and a plurality of subscribers, typically over coaxial and/or fiber optic cables. Most conventional cable television networks comprise hybrid fiber-coaxial networks. In these networks, fiber optic cables are typically used to carry signals from the headend facilities of the service provider to various distribution points, while less expensive coaxial cable may be used, for example, to carry the signals into neighborhoods and/or into individual homes, apartment complexes, businesses and other subscriber premises.

Typically, the service provider is a cable television company that may have exclusive rights to offer cable television services in a particular geographic area. The subscribers in a cable television network may include, for example, individual homes, apartments, hotels, businesses, schools, government facilities and various other entities. The service provider may broadcast a broad variety of cable television channels to subscribers over the cable television network. Most cable television service providers also now offer other services such as, for example, broadband Internet service and digital telephone service. Thus, in many cases, a subscriber of the service provider may receive cable television service, a broadband Internet connection, and Voice-over-Internet Protocol ("VoIP") Internet telephone service all through a single RF connection over the cable television network between the service provider and the subscriber premise.

To provide services to individual subscriber premises, tap units are typically connected in series along communications lines (e.g., a coaxial cable) of the cable television network. These tap units typically have an input port that connects to a first segment of the communications line, an output port that connects to a second segment of the communications line, and one or more RF tap ports. Cables, such as, for example, coaxial cables, may run between each RF tap port of a tap unit and a respective subscriber premise. In this manner, each RF tap port acts as a branch off of the communications line that is used to provide a communications path between the service provider and an individual subscriber premise over the cable television network. RF signals are transmitted through each RF tap port between the cable television network and an individual subscriber premise. Typically, a tap unit will include multiple tap ports (e.g., four or eight RF tap ports).

In residential applications, because of attenuation that occurs as signals are passed through the communications lines of the cable television network and through various connections such as tap units, the power level of the RF signal that is received at subscriber premises may be on the order of 5 dBmV/channel, which may be insufficient to support the various services at an acceptable quality of service level. Accordingly, an RF signal amplifier may be provided at many individual subscriber premises that is used to amplify the RF signal received over the RF connection between the cable television network and the subscriber premises to a more useful level of approximately 20 dBmV/channel. In some cases, the RF signal amplifier may also amplify any RF signals that are transmitted in the reverse direction from the subscriber premise to the cable television network (note that broadband Internet and Internet telephone service both involve full duplex transmissions, as does some types of cable television service such as pay-per-view service). These RF signal amplifiers typically include an RF input port that is connected to an RF tap port of a tap unit by, for example, a coaxial cable, and at least one RF output port. An exemplary RF signal amplifier may include a power divider circuit that provides four or eight RF output ports, as typical subscriber premises include multiple RF wall jacks, each of which requires a separate connection to the cable television network. Each RF signal amplifier includes one or more power amplifiers that are used to amplify the RF signals that pass therethrough. A direct current ("DC") power connection is also provided, either through a separate power input port or through one of the RF output ports (an output port may be configured to provide both the DC power connection and to pass RF signals). The DC power connection is used to power the power amplifiers that amplify the RF signals that are passed through the RF signal amplifier.

Unfortunately, if the power connection to the RF signal amplifier is interrupted, the power amplifiers cease operating, and RF signals hence cease to pass through the power amplifiers. As a result, service between the cable television network and the subscriber premise is interrupted. Although such interruptions may be tolerated by consumers in relation to certain non-essential services, interruptions to other services may be unacceptable. For example, consumers relying on IP-based emergency communications (i.e., Internet telephone 911 service) can be left without such services during power interruptions.

SUMMARY

Pursuant to embodiments of the present invention, distribution and amplification systems for cable television networks are provided. These systems include a tap unit that has at least a first RF tap port and a second RF tap port. A voice-over IP ("VoIP") RF signal amplifier is connected to the first RF tap port of the tap unit. This VoIP RF signal amplifier includes a first amplified signal path that connects an RF input port of the VoIP RF signal amplifier to a first RF output port of the VoIP RF signal amplifier and a second, passive, non-interruptible signal path that connects the RF input port of the VoIP RF signal amplifier to a second RF output port of the VoIP RF signal amplifier. A non-VoIP RF signal amplifier is connected to the second RF tap port of the tap unit. This non-VoIP RF signal amplifier includes a first amplified signal path through the non-VoIP RF signal amplifier that connects an RF input port of the non-VoIP RF signal amplifier to a first RF output port of the non-VoIP RF signal amplifier. The VoIP RF signal amplifier is configured to terminate the first amplified signal path to a first matched termination when an electrical power feed to a power input of the VoIP RF signal amplifier is interrupted, and the non-VoIP RF signal amplifier is likewise configured to terminate the first amplified signal path of the non-VoIP RF signal amplifier to second matched termination when the electrical power feed to a power input of the non-VoIP RF signal amplifier is interrupted.

In some embodiments, the VoIP RF signal amplifier may include a first switching device having an input that is coupled to the RF input port of the VoIP RF signal amplifier, a first output that is coupled to a first power amplifier of the VoIP RF signal amplifier, and a second output that is coupled to the first matched termination. The non-VoIP RF signal amplifier may include a second switching device having an input that is coupled to the RF input port of the non-VoIP RF signal amplifier, a first output that is coupled to a second power amplifier of the non-VoIP RF signal amplifier, and a second output that is coupled to the second matched termination. The VoIP RF signal amplifier may also include a first directional coupler having an input that is coupled to the RF input port of the VoIP RF signal amplifier, a first output that is connected to the input of the first switching device and a second output that is connected to the second RF output port of the VoIP RF signal amplifier via the second passive, non-interruptible communication path.

In some embodiments, the VoIP RF signal amplifier may also include a first diplexer that is coupled between the first output of the first switching device and the input of the first power amplifier and a second diplexer that is coupled between an output of the first power amplifier and the first RF output port. The non-VoIP RF signal amplifier may similarly include a first diplexer that is coupled between the first output of the second switching device and the input of the second power amplifier and a second diplexer that is coupled between an output of the second power amplifier and the first RF output port of the non-VoIP RF signal amplifier. The tap unit may include a tap directional coupler that has a first output that is connected to the first RF tap port and a second output that is connected to the second RF tap port. In such embodiments, the VoIP RF signal amplifier may be connected to the first RF tap via a first cable and the non-VoIP RF signal amplifier may be connected to the second RF tap via a second cable.

In some embodiments, the VoIP RF signal amplifier may be connected to a first premise of a first subscriber who receives Internet telephone service, and the non-VoIP RF signal amplifier may be connected to a second premise of a second subscriber who does not receive Internet telephone service. The first and second premises may both be within the same multi-dwelling unit. The first matched termination may be a first resistor that is terminated to a ground voltage and the second matched termination may be a second resistor that is terminated to the ground voltage.

In some embodiments, the system may also include a first power regulation circuit that receives electrical power from the power input of the VoIP RF signal amplifier and that outputs a first power supply voltage to the first power amplifier and the first switching device. The system may also include a second power regulation circuit that receives electrical power from the power input of the non-VoIP RF signal amplifier and that outputs a second power supply voltage to the second power amplifier and the second switching device.

Pursuant to still further embodiments of the present invention, methods of providing subscription services to first and second subscriber premise of a multi-dwelling unit over a cable television network are provided. Pursuant to these methods, a tap unit that includes a first RF tap port and a second RF tap port is installed on a communications line of the cable television network. A VoIP RF signal amplifier is connected to the first RF tap port, and a non-VoIP RF signal amplifier is connected to the second RF tap port. A first subscription service is provided to the first subscriber premise through a first amplified signal path through the VoIP RF signal amplifier. A second subscription service is provided through a second signal path through the VoIP RF signal amplifier to the first subscriber premise. A third subscription service is provided to the second subscriber premise through a first amplified signal path through the non-VoIP RF signal amplifier. In response to an electrical power feed to the VoIP RF signal amplifier being interrupted, the first amplified signal path of the VoIP RF signal amplifier is automatically terminated to a first matched termination. In response to an electrical power feed to the non-VoIP RF signal amplifier being interrupted, the first amplified signal path of the non-VoIP RF signal amplifier is automatically terminated to a second matched termination.

In some embodiments, the VoIP RF signal amplifier and/or the non-VoIP RF signal amplifier may have some or all of the features and configuration of the above-described VoIP and non-VoIP RF signal amplifiers.

Pursuant to further embodiments of the present invention, methods of retrofitting a distribution and amplification system that includes a tap unit and at least one non-VoIP RF signal amplifier that is connected to an RF tap port of the tap unit are provided. Pursuant to these methods, a self-termination unit that includes a switching device that terminates to a matched termination when an electrical power feed to the self-termination unit is interrupted is installed between the RF tap port and an input port of the non-VoIP RF signal amplifier. This self-termination unit is then connected to the electrical power feed.

DETAILED DESCRIPTION

Figure 1:
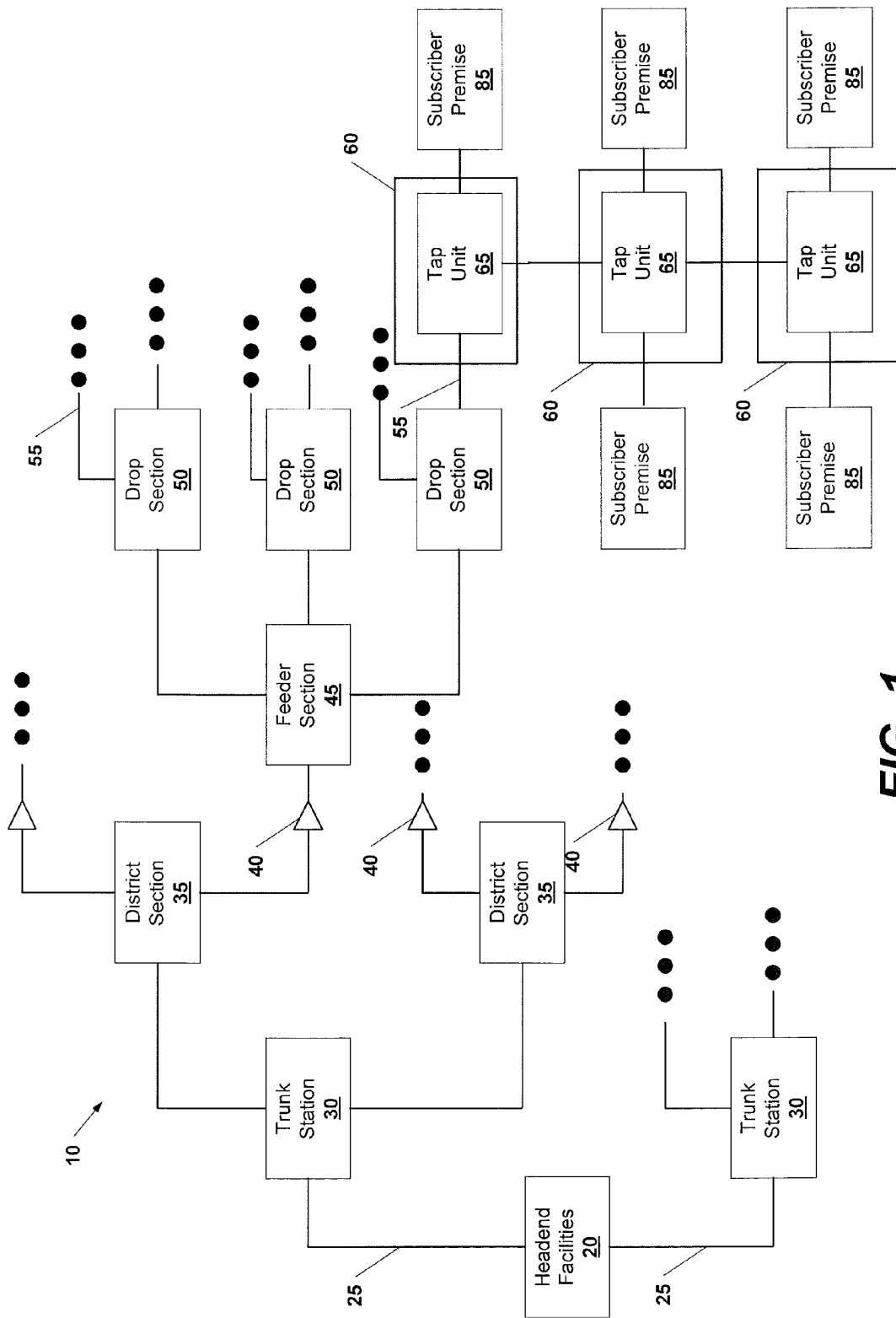
FIG. 1 is a simplified, schematic block diagram of a cable television network.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", etc.).

When cable television networks were only used to provide cable television service, the interruption in service that occurred during a power outage at a subscriber premise because the power amplifier in the RF signal amplifier ceased working was of little consequence, as the television sets in the premise would also lose power. However, with the provision of a much wider variety of services over cable television networks, such service interruptions may be problematic. For example, many states require that Internet telephone service provide emergency "lifeline" service (which is also commonly referred to as "911" service, 24 hours a day, even during power outages. To ensure that Internet telephone 911 service remains operational during power outages at a subscriber premise, service providers install battery backup units on the cable modems of subscribers that purchase Internet telephone service. However, even with such battery backup units, Internet telephone service will only remain operational so long as there are no active components (i.e., components that require an electrical power feed) between the tap unit that the subscriber premise is connected to and the cable modem in the subscriber premise. As noted above, an RF signal amplifier is typically installed between the tap unit and the cable modem to amplify the RF signals received from the cable television network. These RF signal amplifiers typically include one or two active power amplifiers, and hence when power is interrupted, these power amplifiers cease to operate, and all services to the subscriber premise are lost or are inoperable.

In order to maintain Internet telephone service during power outages, RF signal amplifiers have been developed that have a passive, non-interruptible communication path that bypasses all active components in the device. By way of example, U.S. patent application Ser. No. 12/689,267, filed Jan. 19, 2010, the entire content of which is incorporated herein by reference in its entirety, discloses a number of RF signal amplifier designs that include such non-interruptible communications paths for Internet telephone service. In these designs, a directional coupler or other device is used to split the RF signal received at the input port of the RF signal amplifier and feed it to an RF output port of the RF signal amplifier via a fully passive communications path. As such, even if the power feed to the RF signal amplifier is interrupted, the fully passive communications path will still work, and hence can be used for Internet telephone 911 service.

Unfortunately, when the power to the RF signal amplifier is interrupted and the power amplifier(s) included therein shut down, the communications path(s) through the RF signal amplifier that include the power amplifiers simulate an open and/or a non-terminated condition. If, for example, a directional coupler is used to divide the RF signal energy between the fully passive communications path and one or more amplified communications paths, the output of the directional coupler that feeds the amplified communications path(s) will appear unterminated when the power feed to the RF signal amplifier is interrupted, which typically reduces the return loss of the directional coupler to approximately 7 dB. This can significantly degrade the performance on the fully passive communications path. As the fully passive communications path generally has reduced performance anyway (as the RF signal provided over this path is not amplified), it may be difficult to guarantee acceptable performance for 911 Internet telephone service when power to the RF signal amplifier is interrupted and creates an unterminated match.

In an effort to solve this problem, RF signal amplifiers for VoIP Internet telephone service have been developed that automatically terminate the amplified communications path to a matched termination when the power feed to the RF signal amplifier is interrupted. Several exemplary RF signal amplifier designs are disclosed in FIGS. 7, 9a, 9b and 10 of the above-referenced U.S. patent application Ser. No. 12/689, 267. These amplifiers can provide improved VoIP Internet telephone service during power outages.

In most residential applications, the RF signal amplifiers are typically located at or very close to the subscriber premise that the RF signal amplifier serves. A coaxial cable is typically used to connect the RF signal amplifier to a tap port on the tap unit. As the coaxial cable is a 75 ohm cable, the cable acts as a termination to some degree, and the longer the length of cable, the more effectively it will exhibit the characteristics of a matched 75 ohm termination. In typical neighborhoods of single family homes, the coaxial cable lengths are sufficiently long that the coaxial cable, in many cases, can sufficiently terminate the amplified communications paths even when the power feed to the RF signal amplifier is interrupted. However, when RF signal amplifiers are used in multi-dwelling units such as apartment buildings, condominiums and the like or in very closely spaced houses such as townhomes, the coaxial cable lengths may be too short to provide an acceptable termination for the amplified communications paths when the power feed to the RF signal amplifier is interrupted.

The above-described VoIP RF signal amplifiers that include the automatic self-termination feature have generally been provided only to subscribers that order VoIP Internet telephone service, as subscribers that only purchased, for example, cable television and/or broadband Internet service, would have no need for the non-interruptible communications path and/or the self-termination feature. However, when a power outage occurs at, for example, a multi-dwelling unit such as an apartment building, the power feed is typically lost for every RF signal amplifier at the multi-dwelling unit. If some of these RF signal amplifiers comprise conventional RF signal amplifiers that do not have self-terminating capabilities (as would generally be the case if some of the subscribers at the multi-dwelling unit had only ordered cable television and/or broadband Internet service), then during a power outage these non-VoIP RF signal amplifiers will appear unterminated (i.e., they will not have a controlled impedance as seen by the cable television network) and hence may cause network impedance matching issues. As the coaxial cable segments between the RF signal amplifiers and the tap unit may be very short in multi-dwelling units, these cable segments may not sufficiently compensate for the unterminated condition. Accordingly, where both a VoIP RF signal amplifier and a conventional non-VoIP RF signal amplifier are connected to the same tap unit, during a power outage, the unterminated non-VoIP RF signal amplifier may cause impedance mismatches that may result in packet or data loss that can degrade or cause the loss of the non-interruptible VoIP communications path through the VoIP RF signal amplifier.

Pursuant to embodiments of the present invention, RF distribution and amplification systems are provided that include both VoIP and non-VoIP RF signal amplifiers that self-terminate the amplified communications paths thereof in the event of a power outage. These RF distribution and amplification systems may provide improved VoIP Internet telephone service to subscribers thereof in the event of a power outage, particularly at multi-dwelling units or other installations where the RF signal amplifiers are located in close proximity to their tap units.

FIG. 1 is a simplified, schematic block diagram of a cable television network 10. As shown in FIG. 1, the cable television network 10 includes headend facilities 20 where signals (e.g., broadcast and other signals) from various sources, such as transmissions from satellites, microwave, fiber optic and other sources, are gathered and processed for transmission over the cable television network 10. These signals are distributed via a main or "trunk" network 25 to trunk stations 30. The signals may be further distributed from each trunk station 30 to a plurality of district sections 35, where the signals are typically amplified by amplification units 40. Each district section 35 may feed a plurality of feeder sections 45. Each feeder section 45 may feed a plurality of drop sections 50. The cables 55 running from each drop section 50 are routed through neighborhoods and the like, and a plurality of distribution and amplification systems 60 are provided that connect individual subscriber premises 85 to the cable television network 10. As shown in FIG. 1, each distribution and amplification system 60 includes a tap unit 65 that may provide connections to one or more subscriber premises 85. The individual subscriber premises 85 may comprise, for example, single dwelling homes, multiple dwelling units such as apartment buildings, condominiums, hotels and the like, businesses, schools, government facilities etc. Typically, the tap units 65 are located outside, perhaps within an enclosure, near the subscriber premises 85 (i.e., on the outside of a building, in a cable box near the street, etc.).

As known to those of skill in the art, both "downstream" and "upstream" signals may be transmitted over a cable television network such as the network 10 of FIG. 1. The "downstream" signals refer to signals that are transmitted from the headend facilities 20 to one or more subscriber premises 85, while the "upstream" signals refer to signals that are transmitted from individual subscriber premises 85 back to the headend facilities 20. Typically, the "downstream" signals are transmitted in the 51-1000 MHz frequency band, and may include, for example, the different tiers of cable television channels, movies on demand, digital telephone and/or Internet service (the signals received by the subscriber), and other broadcast or point-to-point offerings. Typically, the "upstream" signals are transmitted in the 5-40 MHz frequency band and may include, for example, digital telephone and/or Internet service (the signals transmitted by the subscriber) and ordering commands (i.e., for movies-on-demand and other services).

It will be appreciated that the cable television network depicted in FIG. 1 is greatly simplified. It will likewise be appreciated that the methods and systems according to embodiments of the present invention discussed below may be used with a wide variety of different cable networks. Thus, it will be appreciated that the cable network depicted in FIG. 1 and the systems and components depicted in the other figures of the present application are exemplary in nature, and are not intended to be limiting as to the scope of the present invention as defined in the claims appended hereto.

Figure 2:
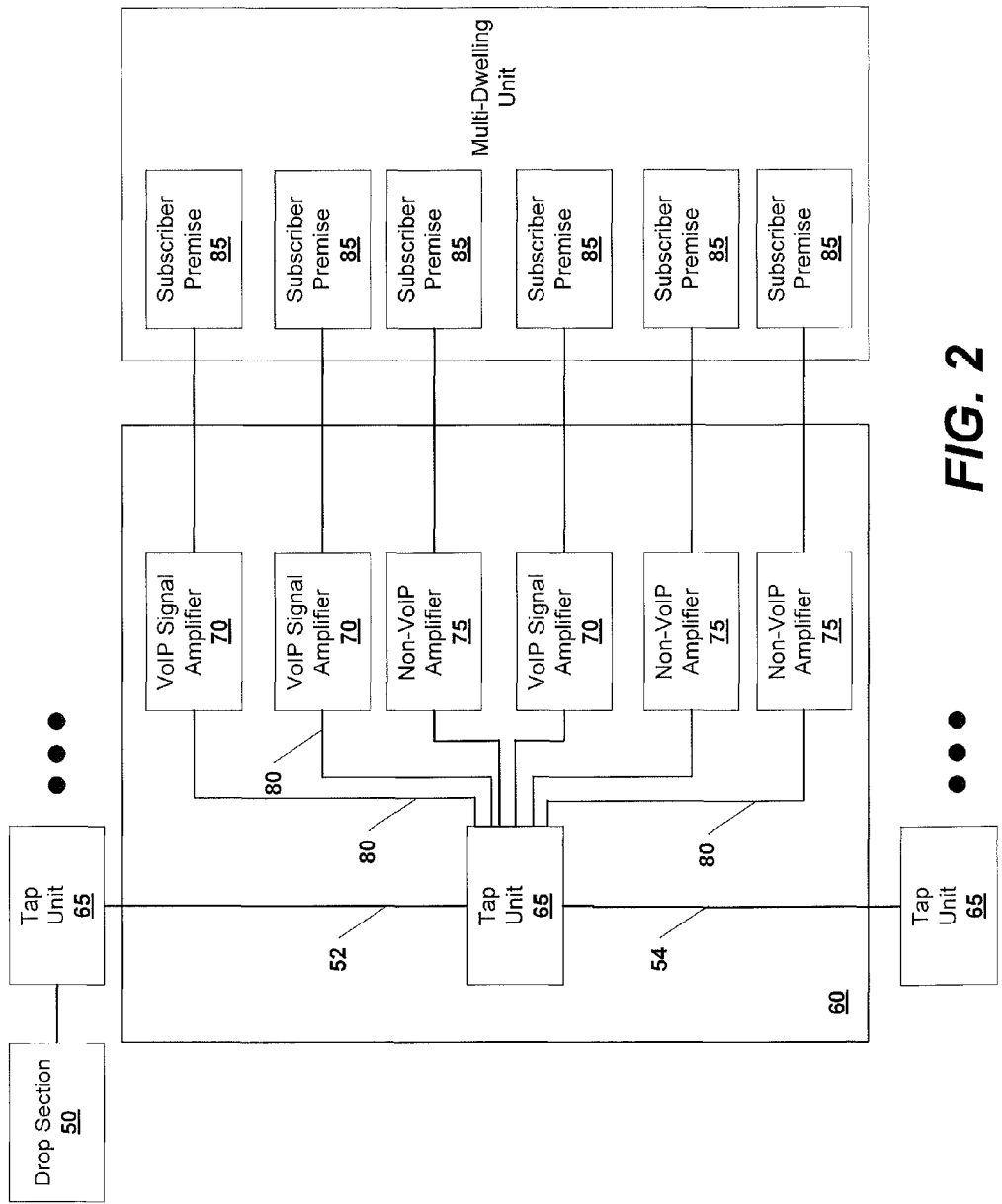
FIG. 2 is a schematic diagram of a distribution and amplification system according to embodiments of the present invention that may be used to connect a plurality of subscriber premises to a cable television network.

According to embodiments of the present invention, distribution and amplification systems 60 are provided that may provide improved performance, particularly during power outages. FIG. 2 is a schematic block diagram that illustrates in further detail the distribution and amplification system 60 according to embodiments of the present invention of FIG. 1. As shown in FIG. 2, a plurality of tap units 65 are connected in series along a cable that extends from a drop section 50 of the cable television network. Each tap unit 65 is part of a distribution and amplification system 60. For simplicity, only a single distribution and amplification system 60 is shown in detail in FIG. 2.

As shown in FIG. 2, the distribution and amplification system 60 comprises the connections between one of the tap units 65 of FIG. 1 and the subscriber premises 85 that are served by the tap unit 65. The distribution and amplification system 60 includes a tap unit 65, a plurality of VoIP RF signal amplifiers 70 and a plurality of non-VoIP RF signal amplifiers 75. Each of the RF signal amplifiers 70, 75 may be connected to a respective RF tap port on the tap unit 65 by a respective coaxial cable 80. In some embodiments, the subscriber premises 85 may all be located in a multi-dwelling unit, and the tap unit 65 may be located outside this multi-dwelling unit. The RF signal amplifiers 70, 75 may be used to provide service to a respective subscriber premise 85 within the multi-dwelling unit. Herein, the term "VoIP RF signal amplifier" refers to an RF signal amplifier that includes a passive, non-interruptible communications path that can be used to provide VoIP service to a subscriber premise during a power outage, whereas the term "non-VoIP RF signal amplifier" refers to an RF signal amplifier that does not include a passive, non-interruptible communications path, and hence cannot provide VoIP service to a subscriber premise during a power outage. The VoIP RF signal amplifier 70 may comprise a conventional VoIP RF signal amplifier such as, for example, the VoIP RF signal amplifier that is disclosed in FIG. 7 of the above-referenced U.S. patent application Ser. No. 12/689,267.

As discussed above, each of the RF signal amplifiers included in the distribution and amplification systems according to embodiments of the present invention may include a self-termination circuit that self-terminates the amplified communications paths thereof to one or more matched terminations when a power feed to the RF signal amplifier is interrupted. As such, the RF signal amplifiers that are connected to a particular tap unit may provide a better impedance match as viewed from the RF tap port of the tap unit during a power outage. As such, the distribution and amplification systems according to embodiments of the present invention may provide enhanced Internet telephone 911 service during power outages to those subscribers who subscribe to such service.

The tap unit 65 may comprise any conventional or non-conventional tap unit. In some embodiments, the tap unit 65 may comprise an addressable tap unit that allows a cable network operator/service provider to control, from a remote location, which signals are passed in the downstream and/or the upstream direction between the cable service provider and the subscriber premises that are connected to the RF tap ports of the addressable tap unit. As known to those of skill in the art, a service provider may use such an addressable tap unit to add, drop and/or change the services provided to a particular subscriber premise without the need to send a service technician to the subscriber site.

In order to facilitate such remote changes to the service provided to a particular subscriber, the addressable tap unit 110 may include a filter circuit that may be used to select specific frequency bands in which signals will or will not be allowed to pass between the service provider and individual subscriber premise. In addition to controlling the services provided to a particular subscriber, these filter circuits may also be used to reduce or minimize noise funneling in the return path. Exemplary addressable tap units are disclosed in U.S. patent application Ser. No. 11/943,244, filed Nov. 20, 2007, the entire content of which is incorporated by reference herein as if set forth in its entirety.

Figure 3:
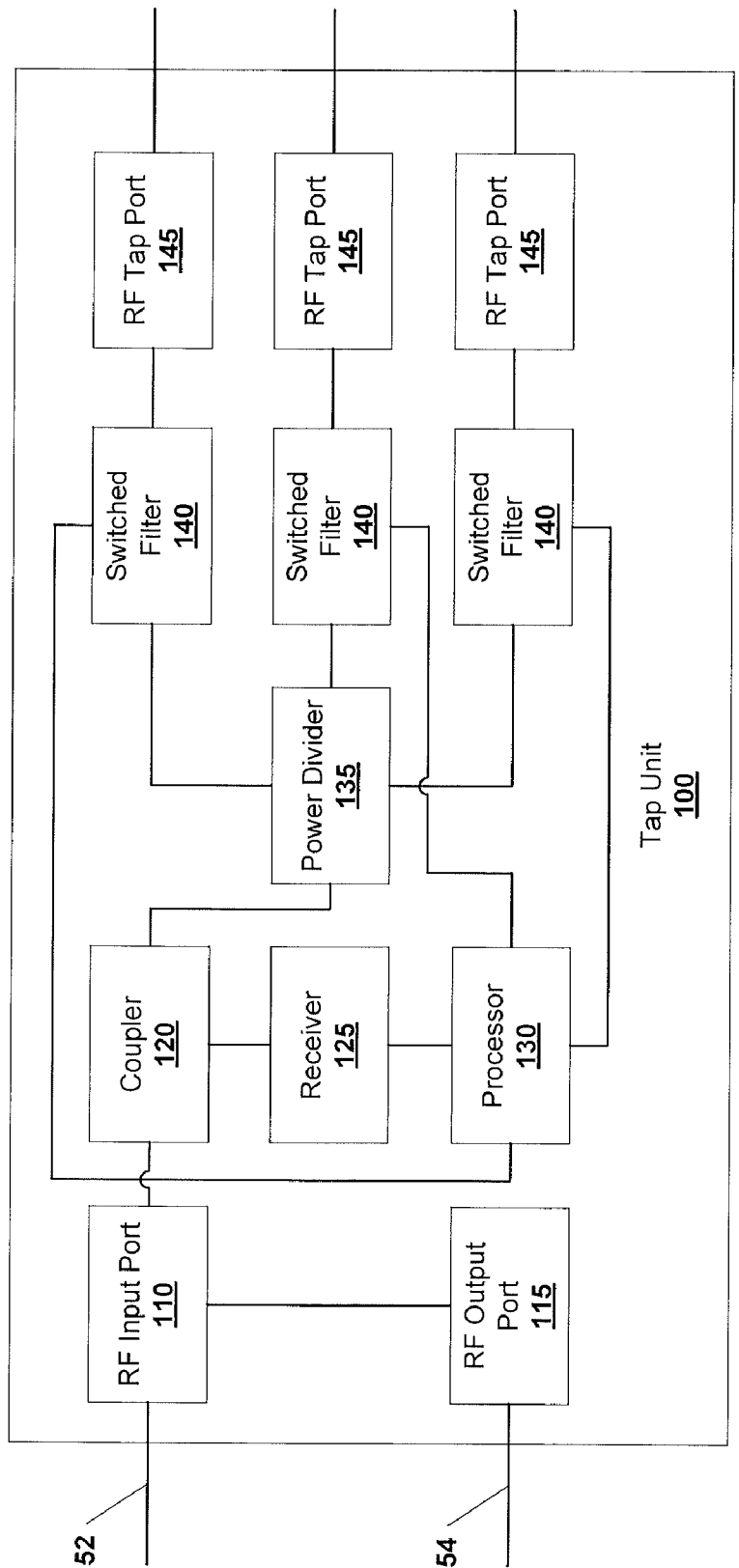
FIG. 3 is a schematic block diagram of an exemplary tap unit that may be used in the distribution and amplification systems according to embodiments of the present invention.

FIG. 3 is a schematic block diagram of an exemplary tap unit 100 that may be used as the tap unit 65 in the distribution and amplification systems 60 according to embodiments of the present invention. As shown in FIG. 3, the tap unit 100 includes an RF input port 110 that receives a cable segment 52 that connects the tap unit 100 to the drop section 50 (or to another tap unit 100), and an RF output port 115 that receives a cable segment 54 that connects the tap unit 100 to yet another tap unit 100. The RF input port 110 and RF output port 115 facilitate connecting the tap unit in series to the cable that extends from the drop section 50 so that a plurality of tap units 100 may be connected to the same drop section along a single "cable" that comprises a plurality of cable sections.

As further shown in FIG. 3, the RF signal is split at the RF input port 110 (typically using a directional coupler that is part of the RF input port 110), with most of the signal energy being passed to the RF output port 115, while the remaining signal energy is passed to a coupler 120. The coupler 120 is used to split off a small portion of the signal energy so that control information that may be embedded in the received RF signals that are used to control the addressable tap unit may be passed to a receiver 125 which demodulates the received signals to extract this control information. The control information is then passed to a processor 130. The processor 130 generates control signals in response to the control information that are used to control a plurality of switched filters 140 of tap unit 100 in the manner describer below.

The second output of the coupler 120 is connected to an input of a power divider network 135. The power divider network may comprise, for example, a layered network of splitters or directional couplers that divide and further divide the received RF input signal into a desired number of signals. For simplicity, the depicted power divider network 135 is a 1×3 power divider network, although 1×4 and 1×8 power divider networks are more commonly used in practice. Each output of the power divider network is input into a respective one of a plurality of switched filters 140. Each switched filter 140 may include a plurality of different signal paths that pass signals in different bandwidths. For example, in some embodiments, the switched filters 140 may include a first path that passes all signals in the upstream and downstream frequency bands, a second path that only passes signals in the downstream frequency band, a third path that passes selected portions of the downstream frequency band and selected portions of the upstream frequency band, and a fourth signal path that does not pass any of the downstream or upstream frequency band. The switched filters 140 are controlled by control signals that are passed from the microprocessor 130 that select on of the signal paths through each switched filter 140. The output of each switched filter 140 is passed to an RF tap port 145. Each RF tap port 145 receives a coaxial cable that connects the tap port to a subscriber premise (or to an RF signal amplifier that is associated with a subscriber premise).

While FIG. 3 illustrates one exemplary tap unit that may be used in the distribution and amplification systems according to embodiments of the present invention, it will be appreciated that any suitable tap unit may be used. For example, non-addressable tap units could be used in place of the tap unit 100 described above with reference to FIG. 3.

Figure 4:
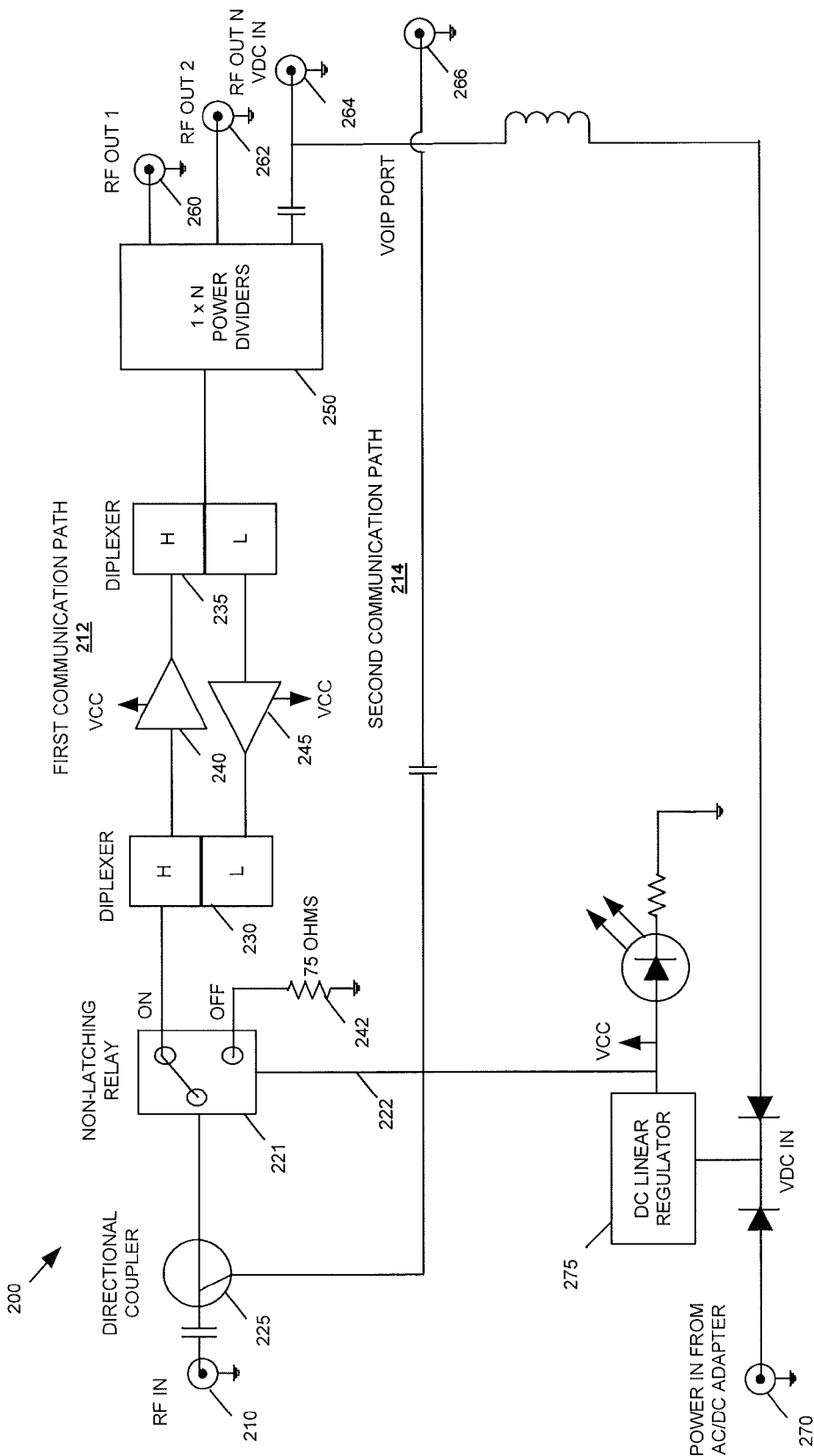
FIG. 4 is a simplified block diagram of a bi-directional VoIP RF signal amplifier that includes a non-interruptible communications path and a self-terminating active communications path according to certain embodiments of the present invention.

FIG. 4 is a schematic block diagram of an VoIP RF signal amplifier 200 that may be used to implement each of the VoIP RF signal amplifiers 70 in the distribution and amplification system 60 of FIG. 2. As shown in FIG. 4, the VoIP RF signal amplifier 200 includes a bi-directional RF input port 210 for receiving RF signals from the tap unit 65 that may be amplified and passed to a subscriber premise 85. The RF input port 210 is also used to pass output signals in the reverse direction from the subscriber premise 85 to the tap unit 65.

RF signal amplifier 200 further includes a plurality of bi-directional output ports 260, 262, 264 and 266 that may be used to pass RF signals from the RF signal amplifier 200 to one or more devices that are located, for example, in the subscriber premise 85, and to pass signals from such devices to the RF signal amplifier 200. It will be appreciated that any appropriate device that may send and/or receive an RF signal may be placed in communication with one or more of the various output ports 260, 262, 264 and/or 266 of the RF signal amplifier 200. For example, devices such as Internet telephones, cable television sets, cable modems and/or other data communication devices may be connected to the RF signal amplifier 200 via the various output ports 260, 262, 264 and/or 266 when the RF signal amplifier 200 is installed in or outside a particular subscriber premise 85. However, it will further be appreciated that any desired combination of these and/or other devices may be used where appropriate.

As shown in FIG. 4, RF signals that are received through input port 210 are passed through a passive directional coupler 225 to first and second communications paths 212, 214. It will be appreciated that the directional coupler 225 may either evenly or unevenly split the power of the input signals between the first and second communications paths 212, 214, depending on the design of the overall circuit. As shown in FIG. 4, the first communication path 212 includes a switching device 221 (implemented as an SPDT non-latching relay), a high/low diplexer 230, a power amplifier 240, a power amplifier 245, a high/low diplexer 235 and a 1×N power divider circuit 250, which components connect the first output of the directional coupler 225 to the output ports 260, 262 and 264. In particular, the signals output by the directional coupler 225 to the first communications path 212 are first input to the SPDT non-latching relay 221. When the non-latching relay 221 is in the "ON" or "SET" state, these signals then pass to a high/low diplexer 230 for separating the high frequency input signal from any low frequency output signal incident in the reverse direction. In various embodiments, diplexer 230 can filter the signals in a manner such that signals with frequencies greater than approximately 45-50 MHz are passed as high frequency input signals received from the RF input port 210, while signals with frequencies lower than such range are passed in the reverse direction as low frequency output signals received from ports 260, 262, and/or 264.

The high frequency input signals filtered by diplexer 230 can be amplified by the power amplifier 240, and passed to the high/low diplexer 235. The output of diplexer 235 is then provided to the 1×N power divider circuit 250, where the RF signal is divided and distributed to ports 260, 262, and/or 264.

Turning now to the reverse signal flow through the first communication path 212 of RF signal amplifier 200, RF signals received by the RF signal amplifier 200 from devices in communication with ports 260, 262 and/or 264 can be passed to the power divider circuit 250 where these RF signals are combined into a composite RF output signal. This composite RF output signal is fed through the high/low diplexer 235, which separates the low frequency composite RF output signal from any high frequency input RF signals that are incident in the forward direction. As discussed above with respect to the diplexer 230, the diplexer 235 can filter the signals such that signals with frequencies greater than approximately 45-50 MHz are passed in the forward direction as high frequency signals received from RF input port 210, while signals with frequencies lower than 45-50 MHz are passed in the reverse direction as low frequency signals received from RF output ports 260, 262, and/or 264.

The low frequency output signals filtered by diplexer 235 are amplified by the power amplifier 245, and passed to high/low diplexer 230 where they are combined with the input signals. In various embodiments, the power amplifier 245 can optionally be omitted from RF signal amplifier 200. The recombined signal can then be provided to non-latching relay 221 where it is passed to the RF input port 210 via the directional coupler 225 for output to a service provider via the tap unit 65. The power amplifiers 240 and 245 may have different gains. For example, in some embodiments, power amplifier 240 may have about 18 dB gain, while power amplifier 245 may have about 15 dB gain. An attenuator (not shown in FIG. 4) may also be provided, for example, between power amplifier 245 and diplexer 235.

During normal operation, the RF signal amplifier 200 can be powered from a power input port 270 and/or power that is reverse fed through RF OUT N/VDC IN port 264. In a typical installation at a subscriber premise, the RF signal amplifier 200 may be powered by an AC/DC adapter receiving power provided by the residence (for example, 100-230 VAC, 50/60 Hz). As illustrated in FIG. 4, the power received from either power input can be provided to a voltage regulator 275 which supplies an operating voltage VCC to the power amplifiers 240 and/or 245.

In the event that power to voltage regulator 275 is interrupted, voltage regulator 275 will be unable to provide operating voltage VCC to the power amplifiers 240 and/or 245. As a result, power amplifier 240 will not function to amplify the input signals received through the RF input port 210 for proper distribution to the various RF output ports 260, 262, and/or 264. Similarly, power amplifier 245 also will not function to amplify the output signals received from ports 260, 262, and/or 264.

Accordingly, RF signal amplifier 200 further provides a second, non-interruptible communication path 214 between RF input port 210 and a VoIP RF output port 266. In particular, as shown in FIG. 4, the signals output by directional coupler 225 to the second communications path 214 may be passed directly to the VoIP output port 266.

Thus, the directional coupler 225 is used to split a signal received through the RF input port 210 into two separate components, and delivers the first component of the split signal to RF output ports 260, 262 and 264 via the first communications path 212 and delivers the second component of the split signal to VoIP output port 266 via the second communication path 214. Consequently, even if power is interrupted such that the power amplifiers 240 and 245 are rendered inoperable, a second, non-interruptible communication path 214 still exists between RF input port 210 and VoIP output port 266 which can be used to support communication of at least one or more services. It will be appreciated that although the second communication path 214 of amplifier 200 does not necessarily amplify the input or output signals, the second communication path 214 can nevertheless permit communication of at least one or more services, such as Internet telephone emergency 911 service.

As is also illustrated in FIG. 4, amplifier 200 provides a VCC path 222 to relay 221. When power (i.e., VCC) is interrupted, the relay 221 will automatically switch from the normal signal path in the "ON" (or "SET") position, to the "OFF" (or "RESET") position (or vice versa when power is resumed). The second output port of relay 221 (the "OFF" port) is connected to a matched resistive termination (here a 75 ohm resistor 242). When the power supply is interrupted, the relay 221 senses the interruption and switches from the "ON" position to the "OFF" position. As the OFF position of relay 221 is coupled to the matched resistive termination, both outputs of the directional coupler 225 are matched. As such, signal degradation due to reflections and the like can be reduced or minimized in order to provide acceptable signal quality on the second, non-interruptible communications path 214. A communication device in communication with output port 266 (such as a VoIP compatible device, or other device) can further be provided with backup battery power to maintain the operation of the device.

As should be clear from the above description, the amplifier 200 of FIG. 4 includes a selective termination circuit that is configured to pass signals between the RF input port and a first RF output port over a first, amplified, communication path 212 when electrical power is received at the power input 270, and is further configured to terminate the first communication path 212 to a matched termination 242 when an electrical power feed to the power input 270 is interrupted. In the particular embodiment of FIG. 4, this selective termination circuit comprises a relay 221 that completes the first communication path 212 when electrical power is received at the power input 270, but terminates the first communication path 212 to the matched termination 242 when an electrical power feed to the power input 270 is interrupted.

Herein, the term "matched termination" is used to refer to a termination that approximately matches the specific transmission paths impedance (in this case 75 ohms), thus being capable of substantially absorbing the possible propagation modes with relatively minimal reflection. The term "resistive termination" is used to refer to a termination that includes at least one purposefully resistive element such as a resistor. By providing such a matched resistive termination 242 in signal amplifier 200, the directional coupler 225 may be configured to have two impedance matched output terminals even when the integrated circuit chip containing the power amplifiers 240 and 245 shuts down for lack of power, and hence reflections that result in return loss, frequency response and/or other signal degradation can be reduced in these circumstances. This may significantly improve the signal quality on the second, non-interruptible communication path 214 (in both the forward and reverse directions) when the first communication path 212 is inactive (i.e., terminated to the matched resistive termination).

Figure 5:
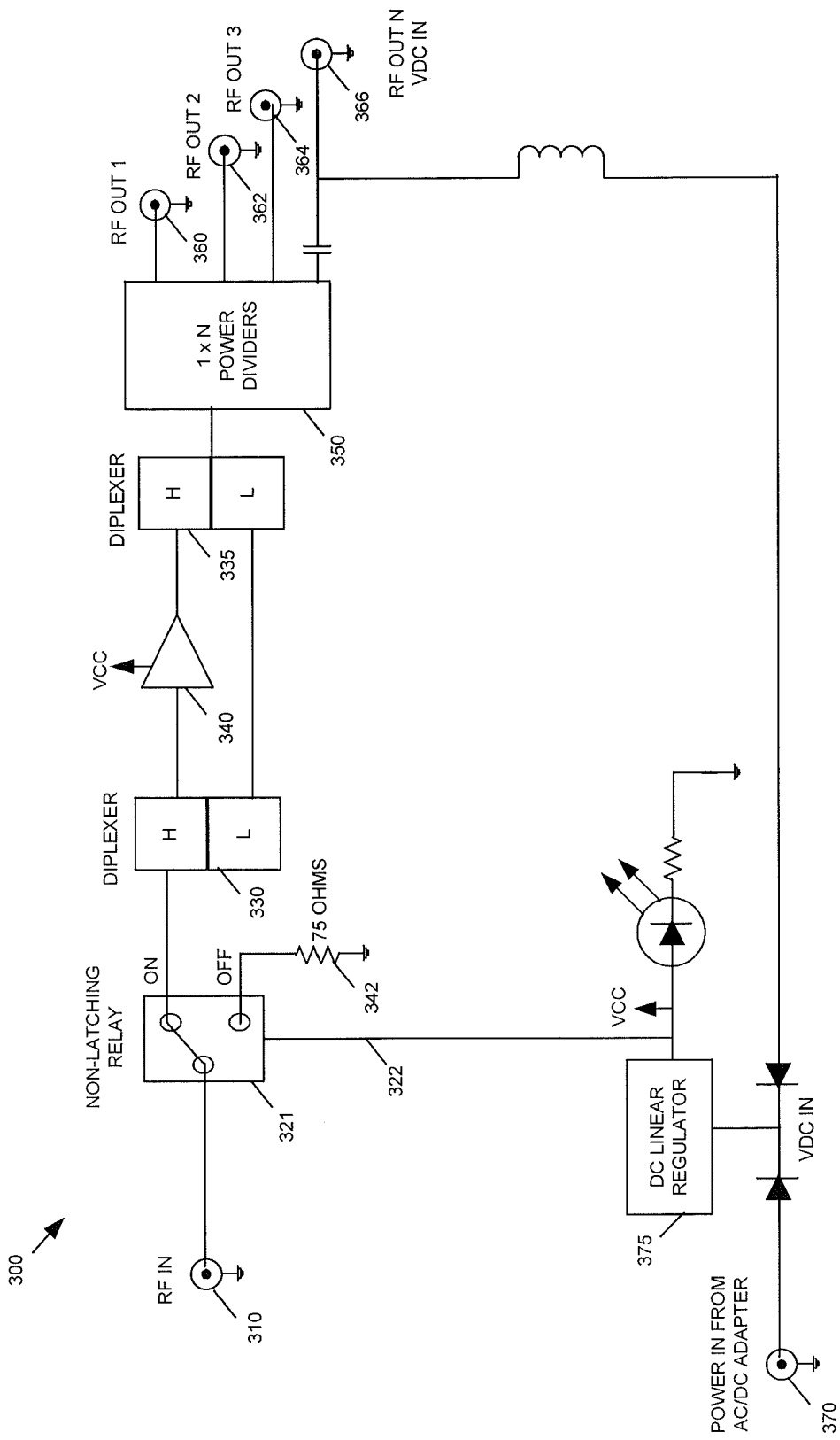
FIG. 5 is a simplified block diagram of a bi-directional non-VoIP RF signal amplifier that includes a self-terminating active communications path according to certain embodiments of the present invention.

FIG. 5 is a schematic block diagram of a non-VoIP RF signal amplifier 300 that may be used to implement each of the non-VoIP RF signal amplifiers 75 in the distribution and amplification system 60 of FIG. 2. The non-VoIP RF signal amplifier 75 may be very similar to the VoIP RF signal amplifier 70 of FIG. 4, except that the non-VoIP RF signal amplifier 75 does not include the second, non-interruptible communications path 214 that may be used to provide Internet telephone emergency 911 service, for example, during a power outage.

In particular, as shown in FIG. 5, the non-VoIP RF signal amplifier 300 includes a bi-directional RF input port 310 and a plurality of bi-directional output ports 360, 362, 364 and 366. The RF input port 310 may be identical to the RF input port 210 of the RF signal amplifier 200 of FIG. 4, and the RF output ports 360, 362, 364 and 366 may be identical to any of the RF output ports 260, 262, 264 of RF signal amplifier 200, and hence further description of these components will be omitted.

RF signals that are received through input port 310 are passed directly to an SPDT non-latching relay 321. As the amplifier 300 does not provide a non-interruptible communications path for supporting Internet telephone emergency 911 service during power outages, the passive directional coupler 225 that is provided in the RF signal amplifier 200 of FIG. 4 may be omitted in the RF signal amplifier 300 of FIG. 4. The first output of the SPDT non-latching relay 321 is coupled to a first high/low diplexer 330. The diplexer 330 can filter the signals in a manner such that signals with frequencies greater than approximately 45-50 MHz are passed as high frequency input signals received from the RF input port 310, while signals with frequencies lower than such range are passed in the reverse direction as low frequency output signals received from ports 360, 362, 364 and/or 366. The high frequency output of the first high/low diplexer 330 is coupled to the input of a power amplifier 340 that amplifies the RF signals that are received at the RF input port before they are passed to the subscriber premise through the RF output ports 360, 362, 364 and 366. The output of the power amplifier 340 is coupled to the high frequency input of a second high/low diplexer 335. The output of the second high/low diplexer 335 is coupled to a 1xN power divider circuit 350 that divides the RF signal and distributes it to, in this particular embodiment, the four RF output ports 360, 362, 364 and 366. The second output of the SPDT non-latching relay 321 is coupled to a matched termination 342.

Turning to the reverse signal flow, RF signals received by the RF signal amplifier 300 from devices in communication with ports 360, 362, 364 and/or 366 can be passed to the power divider circuit 350 where these RF signals are combined into a composite RF output signal. This composite RF output signal is fed through the high/low diplexer 335, which separates the low frequency composite RF output signal from any high frequency input RF signals that are incident in the forward direction. The diplexer 335 can filter the signals such that signals with frequencies greater than approximately 45-50 MHz are passed in the forward direction as high frequency signals received from RF input port 310, while signals with frequencies lower than 45-50 MHz are passed in the reverse direction as low frequency signals received from RF output ports 360, 362, 364 and/or 366.

The low frequency output signals filtered by diplexer 335 are passed directly to the high/low diplexer 330 where they are combined with the input signals. In other embodiments, a power amplifier 345 can optionally be included in the reverse direction path between the high/low diplexers 330 and 335. The recombined signal passes through the non-latching relay 321 to the RF input port 310 for output to a service provider via the tap unit 65.

The non-VoIP RF signal amplifier 300 can be powered from a power input port 370 and/or power that is reverse fed through RF OUT N/VDC IN port 366. The RF signal amplifier 300 may be powered by an AC/DC adapter receiving power provided by the residence. The power received from either power input can be provided to a voltage regulator 375 which supplies an operating voltage VCC to the power amplifier 340.

When the power feed to the voltage regulator 375 is interrupted, the operating voltage VCC is no longer provided to the power amplifier 340, which stops operating. Consequently, amplifier 300 provides a VCC path 322 to the relay 321. When power (i.e., VCC) is interrupted, the relay 321 will automatically switch from the normal signal path in the "ON" (or "SET") position, to the "OFF" (or "RESET") position (or vice versa when power is resumed). The second output port of relay 321 (the "OFF" port) is connected to a matched resistive termination (here a 75 ohm resistor 342). When the power supply is interrupted, the relay 321 senses the interruption and switches from the "ON" position to the "OFF" position. As the OFF position of relay 321 is coupled to the matched resistive termination, the tap unit 65 will see this matched termination as opposed to an open circuited power amplifier. As such, when the power is interrupted to RF signal amplifier 300 the amplifier 300 will not degrade the RF signal quality on other RF signals passed through a common tap unit 65 due to reflections, impedance mismatches and the like, as the amplifier 300 will automatically terminate to a matched termination. While this automatic termination does not benefit the subscriber premise that the amplifier 300 serves, it may reduce or minimize the extent to which RF signal amplifier 300 degrades service to other subscriber premises and, particularly, to other subscriber premises that are served via the same tap unit 65.

Figure 6:
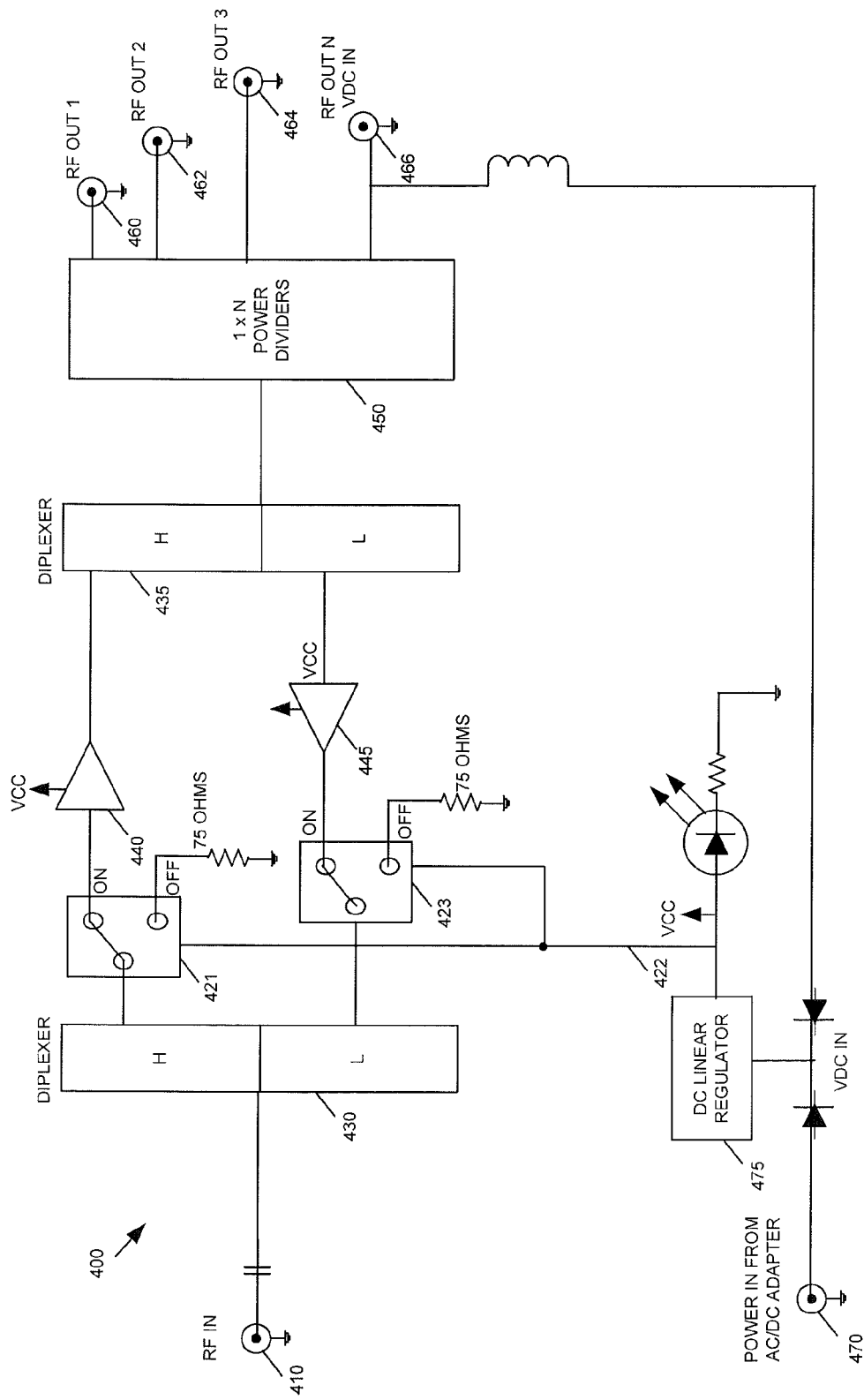
FIG. 6 is a block diagram of another non-VoIP signal amplifier that may be used in the distribution and amplification systems according to embodiments of the present invention.

It will be appreciated that RF signal amplifier 300 is one exemplary non-VoIP signal amplifier. FIG. 6 is a block diagram of another exemplary non-VoIP signal amplifier 400 that may be used in the distribution and amplification systems according to embodiments of the present invention.

Similar to amplifier 300 previously discussed herein, amplifier 400 includes a bi-directional RF input port 410 for receiving RF signals from a service provider and for passing output signals in the reverse direction from the amplifier 400 to the service provider, as well as a plurality of bi-directional output ports 460, 462, 464 and 466. The amplifier likewise includes first and second diplexers 430 and 435, and first and second power amplifiers 440, 445, a power divider network 450, a power input port 470, and a voltage regulator 475. These components operate in the same fashion as their corresponding components in the RF signal amplifiers 200 and 300 of FIGS. 5 and 6, and hence will not be discussed further herein.

The RF signal amplifier 400 also includes a first integrated circuit RF relay chip 421 and a second integrated circuit RF relay chip 423. These relays 421, 423 may operate in the same fashion as relay 321 of RF signal amplifier 300. If the power supply to voltage regulator 475 is interrupted, this interruption is sensed by the relays 421, 423, and causes these relays to each switch from the normal signal path in the "ON" (or "SET") position, to the "OFF" (or "RESET") position (or vice versa when power is resumed). The respective second output ports of relay 421 and 423 (the "OFF" ports) are each connected to a matched resistive termination (here a 75 ohm resistor).

In some embodiments, the relay 421 and the amplifier 440 may be implemented on a single integrated circuit chip, and/or the relay 423 and the amplifier 445 may be implemented on a single integrated circuit chip. It will also be appreciated that in some embodiments, the relays 421 and 423 and the power amplifiers 440, 445 may all be implemented on a single integrated circuit chip.

Thus, pursuant to embodiments of the present invention, distribution and amplification systems are provided that may exhibit better impedance matching and hence provide improved Internet telephone emergency 911 service during power outages to subscribers who order such services. As discussed above, in neighborhoods and multi-dwelling units where cable losses are low, a signal amplifier that becomes unterminated during a power outage can unbalance the power divider network in the tap unit that connects the RF signal amplifier to the cable television network. By deploying non-VoIP RF signal amplifiers that have self-terminating capabilities on tap units that have low cable losses, all of the RF signal amplifiers that are connected to the tap unit may terminate to a matched termination during a power outage, thereby reducing the possibility that the tap unit becomes unbalanced, which may cause degraded or lost Internet telephone emergency 911 service during a power outage.

It will be appreciated that both the VoIP and non-VoIP RF signal amplifiers that have self-terminating capabilities discussed above may comprise a single unit, or may be implemented as multiple different parts. For example, a standard non-VoIP RF signal amplifier may be provided as a first part, and a self-terminating circuit may be provided as a separate, second part that includes, for example, a non-latching relay having a first output port that connects to an input of the RF signal amplifier and a second output that is coupled to a matched termination.

Figure 7:
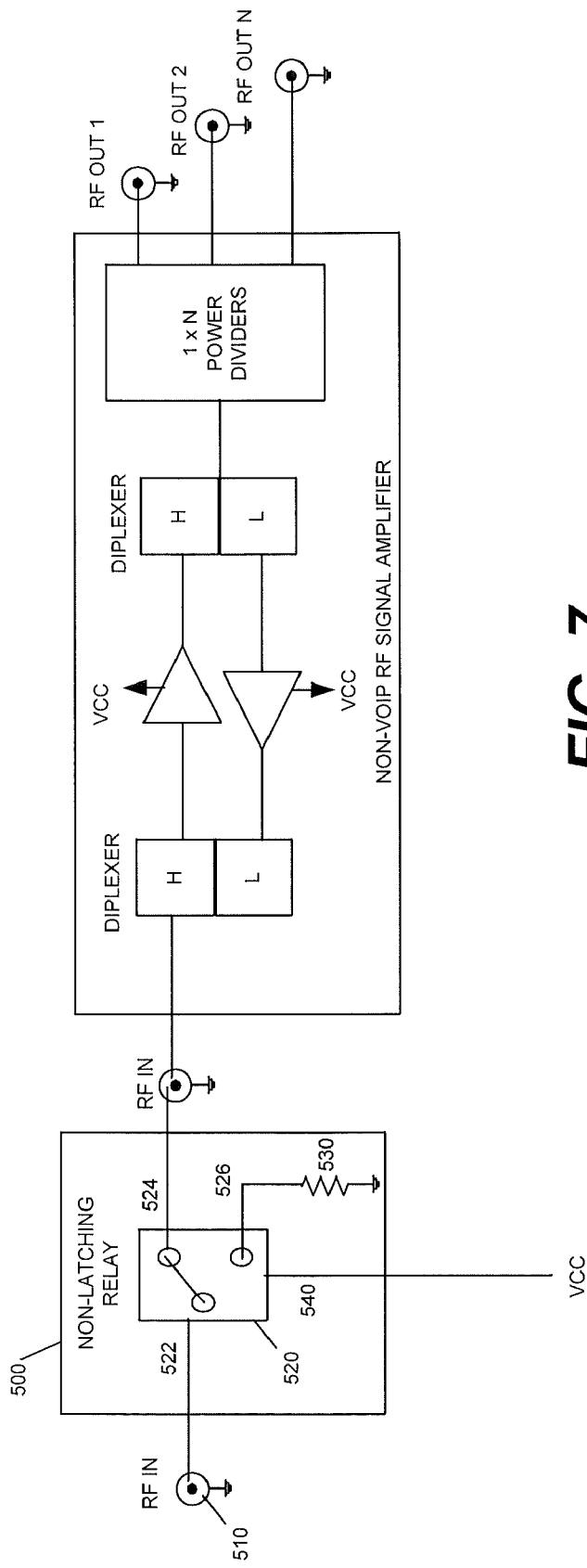
FIG. 7 is a block diagram of a self-termination unit according to embodiments of the present invention that may be used to retrofit a conventional non-VoIP RF signal amplifier to have self-termination capabilities

Pursuant to further embodiments of the present invention, self-termination units for RF signal amplifiers are provided that may be used to retrofit non-VoIP RF signal amplifiers that do not include matcher terminations. FIG. 7 is a block diagram illustrating a self-termination unit 500 that may be placed in series on the cable connection between an RF tap port of a tap unit and a conventional non-VoIP RF signal amplifier to a non-VoIP RF signal amplifier having self-termination capabilities.

As shown in FIG. 7, the self-termination unit 500 includes an RF input port 510 that may receive, for example, a coaxial cable that is connected to an RF tap ort of a tap unit. The self-termination unit 500 further includes a switching device such as a non-latching relay 520. The input 522 of the relay 520 is connected to the RF input port 510 of the self termination unit 500. A first output 524 of the relay 520 is connected to an RF input port of a conventional non-VoIP RF signal amplifier. A second output 526 of the relay 520 is connected to a matched termination 530. The self-termination unit 500 further includes a VCC power input 540. The voltage VCC may be generated within the self-termination unit 500 or may be fed to the self-termination unit 500 from an external source. When power is supplied to the self-termination unit 500, the input 522 of relay 500 connects to the first output 524. When the power supply is interrupted, the relay 520 switches to connect the input 522 to the second output 526, thereby terminating the self-termination unit 500 to a matched termination. In installations where a voltage VCC may be readily provided or generated in the self-termination unit, the self-termination unit 500 may be used to retrofit a non-VoIP RF signal amplifier to have self-terminating capabilities without the need of swapping out an existing RF signal amplifier for one of the non-VoIP RF signal amplifiers according to embodiments of the present invention.

Thus, it will be appreciated that self-termination units such as self-termination unit 500 may be used to retrofit a distribution and amplification system that includes a tap unit and both VoIP and conventional non-VoIP RF signal amplifiers that are connected to RF tap ports of that tap unit. In particular, for each conventional non-VoIP RF signal amplifier that is connected to the tap unit. a self-termination unit that includes a switching device that terminates to a matched termination when an electrical power feed to the self-termination unit is interrupted may be installed between the RF tap port that the non-VoIP RF signal amplifier is connected to and the input port of the non-VoIP RF signal amplifier. Each of these self-termination units may also be connected to an electrical power feed. In this manner, it is not necessary to replace the conventional non-VoIP RF signal amplifiers, as separate, less expensive, self-termination units may instead be used to effectively upgrade each conventional non-VoIP RF signal amplifier.

Figure 8:
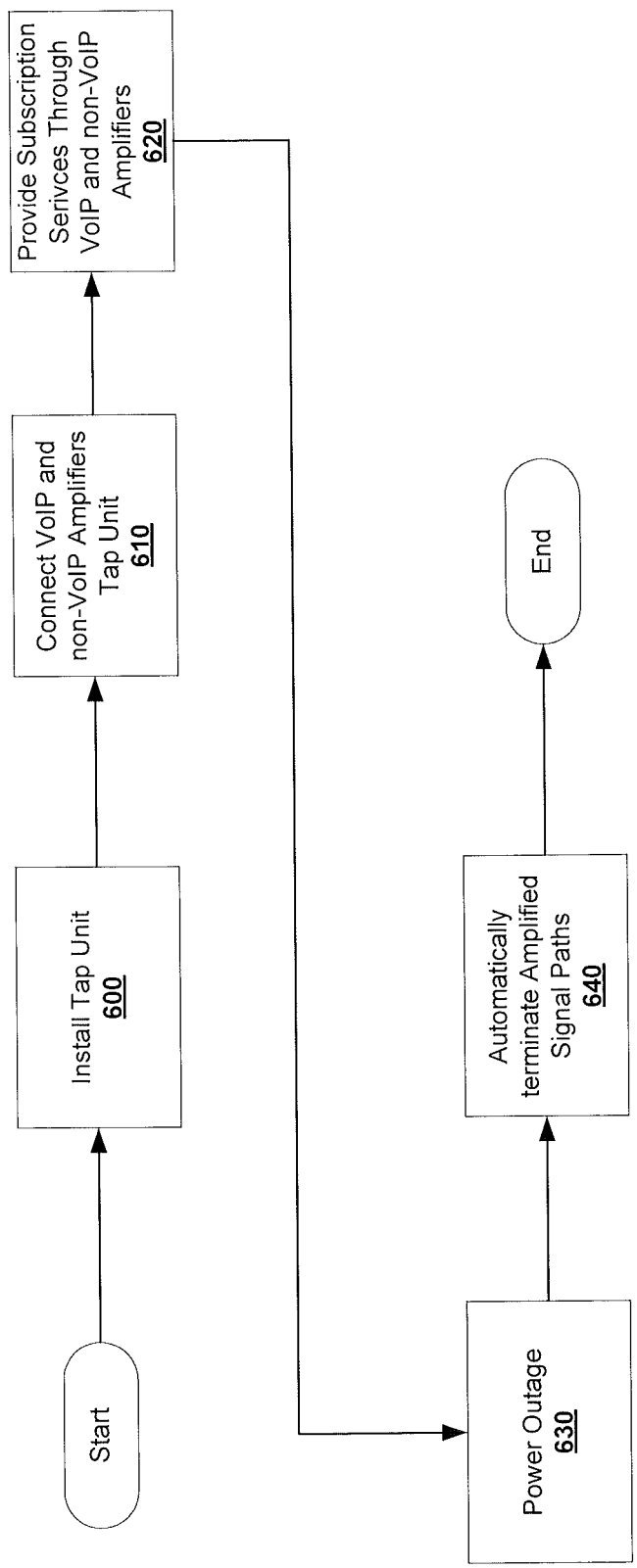
FIG. 8 is a flow chart illustrating methods of providing Internet telephone and cable television services to a first subscriber premise of a multi-dwelling unit and providing cable television service to a second subscriber premise of the multi-dwelling unit over a cable television network according to embodiments of the present invention.

FIG. 8 is a flow chart illustrating methods of providing subscription services to first and second subscriber premise of a multi-dwelling unit over a cable television network according to embodiments of the present invention. As shown in FIG. 8, pursuant to these methods, a tap unit that includes a first RF tap port and a second RF tap port is installed on a communications line of the cable television network (block 600). A VoIP RF signal amplifier is connected to the first RF tap port, and a non-VoIP RF signal amplifier is connected to the second RF tap port (block 610). A first subscription service is provided to the first subscriber premise through a first amplified signal path through the VoIP RF signal amplifier, and a second subscription service is provided to the first subscriber premise through a second signal path through the VoIP RF signal amplifier to the first subscriber premise (block 620). A third subscription service is provided to the second subscriber premise through a first amplified signal path through the non-VoIP RF signal amplifier. After a power outage occurs (block 630), the first amplified signal path of the VoIP RF signal amplifier is automatically terminated to a first matched termination, and the first amplified signal path of the non-VoIP RF signal amplifier is automatically terminated to a second matched termination (block 640).

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure. For example, any number of RF output ports may be supported by the various amplifier embodiments discussed herein.

That which is claimed is:

1. A distribution and amplification system for a cable television network, comprising:
 a tap unit having a first RF tap port and a second RF tap port;
 a voice-over IP ("VoIP") RF signal amplifier that is connected to the first RF tap port of the tap unit, the VoIP RF signal amplifier including a first amplified signal path that connects an RF input port of the VoIP RF signal amplifier to a first RF output port of the VoIP RF signal amplifier and a second, passive, non-interruptible signal path that connects the RF input port of the VoIP RF signal amplifier to a second RF output port of the VoIP RF signal amplifier;
 a non-VoIP RF signal amplifier that is connected to the second RF tap port of the tap unit, the non-VoIP RF signal amplifier including a first amplified signal path through the non-VoIP RF signal amplifier that connects an RF input port of the non-VoIP RF signal amplifier to a first RF output port of the non-VoIP RF signal amplifier;
 wherein the VoIP RF signal amplifier is configured to terminate the first amplified signal path to a first matched termination when an electrical power feed to a power input of the VoIP RF signal amplifier is interrupted; and
 wherein the non-VoIP RF signal amplifier is configured to terminate the first amplified signal path of the non-VoIP RF signal amplifier to second matched termination when the electrical power feed to a power input of the non-VoIP RF signal amplifier is interrupted.

2. The distribution and amplification system of claim 1, wherein the VoIP RF signal amplifier includes a first switching device having an input that is coupled to the RF input port of the VoIP RF signal amplifier, a first output that is coupled to a first power amplifier of the VoIP RF signal amplifier, and a second output that is coupled to the first matched termination, and wherein the non-VoIP RF signal amplifier includes a second switching device having an input that is coupled to the RF input port of the non-VoIP RF signal amplifier, a first output that is coupled to a second power amplifier of the non-VoIP RF signal amplifier, and a second output that is coupled to the second matched termination.

3. The distribution and amplification system of claim 2, wherein the VoIP RF signal amplifier further comprises a first directional coupler having an input that is coupled to the RF input port of the VoIP RF signal amplifier, a first output that is connected to the input of the first switching device and a second output that is connected to the second RF output port of the VoIP RF signal amplifier via the second passive, non-interruptible communication path.

4. The distribution and amplification system of claim 3, wherein the VoIP RF signal amplifier further comprises:
  a first diplexer that is coupled between the first output of the first switching device and the input of the first power amplifier; and
  a second diplexer that is coupled between an output of the first power amplifier and the first RF output port.

5. The distribution and amplification system of claim 4, wherein the non-VoIP RF signal amplifier further comprises:
  a first diplexer that is coupled between the first output of the second switching device and the input of the second power amplifier; and
  a second diplexer that is coupled between an output of the second power amplifier and the first RF output port of the non-VoIP RF signal amplifier.

6. The distribution and amplification system of claim 5, wherein the tap unit includes a tap directional coupler that has a first output that is connected to the first RF tap port and a second output that is connected to the second RF tap port, and wherein the VoIP RF signal amplifier is connected to the first RF tap via a first cable and the non-VoIP RF signal amplifier is connected to the second RF tap via a second cable.

7. The distribution and amplification system of claim 6, wherein the VoIP RF signal amplifier is connected to a first premise of a first subscriber who receives Internet telephone or lifeline service, and wherein the non-VoIP RF signal amplifier is connected to a second premise of a second subscriber who does not receive Internet telephone or lifeline service.

8. The distribution and amplification system of claim 7, wherein the first and second premises are both within the same multi-dwelling unit.

9. The distribution and amplification system of claim 7, wherein the first matched termination comprises a first resistor that is terminated to a ground voltage and wherein the second matched termination comprises a second resistor that is terminated to the ground voltage.

10. The distribution and amplification system of claim 7, further comprising a first power regulation circuit that receives electrical power from the power input of the VoIP RF signal amplifier and that outputs a first power supply voltage to the first power amplifier and the first switching device, and a second power regulation circuit that receives electrical power from the power input of the non-VoIP RF signal ampli-fier and that outputs a second power supply voltage to the second power amplifier and the second switching device.

11. The distribution and amplification system of claim 7, wherein the directional coupler splits an input signal evenly between its first output and its second output.

12. The distribution and amplification system of claim 7, wherein the first amplified signal path includes a forward path that carries RF signals from the RF input port to the first RF output port, the forward path including the first power amplifier, and a reverse path that carries RF signals from the first RF output port to the RF input port.

13. The distribution and amplification system of claim 12, further comprising a third power amplifier that is part of the reverse path.

14. A method of providing subscription services to first and second subscriber premise of a multi-dwelling unit over a cable television network, the method comprising:
  installing a tap unit that includes a first RF tap port and a second RF tap port on a communications line of the cable television network;
  connecting a VoIP RF signal amplifier to the first RF tap port;
  connecting a non-VoIP RF signal amplifier to the second RF tap port;
  providing a first subscription service to the first subscriber premise through a first amplified signal path through the VoIP RF signal amplifier and providing a second subscription service through a second signal path through the VoIP RF signal amplifier to the first subscriber premise when electrical power is received at a power input of the VoIP RF signal amplifier;
  providing a third subscription service to the second subscriber premise through a first amplified signal path through the non-VoIP RF signal amplifier when electrical power is received at a power input of the non-VoIP RF signal amplifier;
  automatically terminating the first amplified signal path of the VoIP RF signal amplifier to a first matched termination in response to the electrical power feed to the VoIP RF signal amplifier being interrupted; and
  automatically terminating the first amplified signal path of the non-VoIP RF signal amplifier to a second matched termination in response to the electrical power feed to the non-VoIP RF signal amplifier being interrupted.

15. The method of claim 14, wherein the VoIP RF signal amplifier includes a first switching device that has first input that is coupled to the first RF tap port, a first output that is coupled to a first power amplifier and a second switch output that is coupled to the first matched termination, and wherein automatically terminating the first amplified signal path of the VoIP RF signal amplifier to the first matched termination in response to the electrical power feed to the VoIP RF signal amplifier being interrupted comprises connecting the first input of the first switching device to the second output of the first switching device in response to the electrical power feed to the VoIP RF signal amplifier being interrupted.

16. The method of claim 15 wherein the non-VoIP RF signal amplifier includes a second switching device that has first input that is coupled to the second RF tap port, a first output that is coupled to a second power amplifier and a second switch output that is coupled to the second matched termination, and wherein automatically terminating the first amplified signal path of the non-VoIP RF signal amplifier to the second matched termination in response to the electrical power feed to the non-VoIP RF signal amplifier being interrupted comprises connecting the first input of the second switching device to the second output of the second switching device in response to the electrical power feed to the non-VoIP RF signal amplifier being interrupted.

17. The method of claim 16, wherein the first matched termination comprises a first resistor that is terminated to a ground voltage and the second matched termination comprises a second resistor that is terminated to the ground voltage.

18. The method of claim 17, further comprising automatically resetting the first switching device to connect the switch input to the first switch output in response to the electrical power feed to the VoIP RF signal amplifier being restored.

19. The method of claim 18, further comprising automatically resetting the second switching device to connect the switch input to the first switch output in response to the electrical power feed to the non-VoIP RF signal amplifier being restored.

20. The method of claim 14, wherein the first subscription service is the same as the third subscription service.

* * * * *